(12) United States Patent
McLean et al.

(10) Patent No.: US 8,369,094 B2
(45) Date of Patent: Feb. 5, 2013

(54) UNIBODY LATCH FOR PLUG-IN UNITS

(75) Inventors: Norris Bernard McLean, East Brunswick, NJ (US); Jignesh Patel, New Milford, NJ (US); Larry Fox, Nanuet, NY (US); Albert Pedoeem, West Orange, NJ (US); Mahesh Mistry, Parsippany, NJ (US); Willie Braun, Franklin Lakes, NJ (US)

(73) Assignee: Fujitsu Limited, Kawasaki-Shi (JP)

( * ) Notice: Subject to any disclaimer, the term of this patent is extended or adjusted under 35 U.S.C. 154(b) by 338 days.

(21) Appl. No.: 12/783,331

(22) Filed: May 19, 2010

(65) Prior Publication Data
US 2011/0286187 A1    Nov. 24, 2011

(51) Int. Cl.
*H05K 7/00* (2006.01)
(52) U.S. Cl. ..................................................... 361/747
(58) Field of Classification Search .................. 361/727, 361/747, 802, 803
See application file for complete search history.

(56) References Cited

U.S. PATENT DOCUMENTS

| | | | |
|---|---|---|---|
| 4,614,389 A | 9/1986 | Albert et al. ............... 339/45 |
| 4,638,405 A | 1/1987 | Smith ........................ 361/399 |
| 4,914,550 A * | 4/1990 | Filsinger et al. ........... 361/715 |
| 5,191,514 A * | 3/1993 | Kabat et al. ............... 361/802 |
| 5,317,480 A | 5/1994 | Chandraiah et al. ....... 361/785 |
| 5,413,497 A * | 5/1995 | Lwee ......................... 439/328 |
| 5,586,003 A * | 12/1996 | Schmitt et al. ......... 361/679.58 |
| 5,673,175 A * | 9/1997 | Carney et al. .......... 361/679.58 |
| 6,208,514 B1 * | 3/2001 | Stark et al. ................ 361/704 |
| 6,276,950 B1 * | 8/2001 | Yodogawa .................. 439/160 |
| 6,288,911 B1 * | 9/2001 | Aoki et al. ................. 361/801 |
| 6,312,275 B1 | 11/2001 | Tortorella .................. 439/341 |
| 6,368,126 B1 * | 4/2002 | Lee ............................ 439/160 |
| 6,443,315 B1 * | 9/2002 | Tabuchi ................... 211/41.17 |
| 6,646,883 B2 * | 11/2003 | Salinas ...................... 361/727 |
| 6,702,598 B1 * | 3/2004 | Lo ............................. 439/157 |
| 6,738,261 B2 * | 5/2004 | Vier et al. .................. 361/740 |
| D498,467 S | 11/2004 | Brogle et al. .............. D13/199 |
| 6,816,388 B2 * | 11/2004 | Junkins et al. ............ 361/801 |
| 6,955,550 B2 * | 10/2005 | Schlack .................... 439/160 |
| 6,992,900 B1 * | 1/2006 | Suzue et al. ............... 361/801 |
| 7,172,441 B2 | 2/2007 | Schlack .................... 439/152 |
| 7,245,499 B2 * | 7/2007 | Stahl et al. ................ 361/754 |
| 7,283,371 B1 * | 10/2007 | Grouell et al. ............ 361/741 |
| 7,292,456 B2 * | 11/2007 | Leung et al. .............. 361/798 |
| 7,292,457 B2 * | 11/2007 | DeNies et al. ............. 361/801 |
| 7,301,778 B1 * | 11/2007 | Fang ......................... 361/759 |
| D568,840 S * | 5/2008 | Hsu .......................... D13/184 |

(Continued)

*Primary Examiner* — Lisa Lea Edmonds
*Assistant Examiner* — Xanthia C Cunningham
(74) *Attorney, Agent, or Firm* — Baker Botts L.L.P.

(57) ABSTRACT

A latch for use with a plug-in unit may comprise a head, a rigid body, a pin, and a lever. The head may be configured to retain the plug-in unit within a chassis associated with a rack system. The rigid body may extend from the head and be configured to interface with a user's fingers. The pin may extend transversely from both sides of the head into a case associated with the plug-in unit and be configured so that the head and the rigid body rotate around the pin as a single body when the rigid body is pulled by the user's fingers. The lever may extend from the rigid body and include a detent configured to engage the chassis. The detent may be configured to restrict the head and the rigid body from rotating around the pin when the detent is engaged with the chassis. The lever may be operable to release the detent from the chassis. The head, the rigid body, the lever, and the detent are manufactured as a single unitary body.

22 Claims, 5 Drawing Sheets

U.S. PATENT DOCUMENTS

| | | | |
|---|---|---|---|
| 7,397,674 B2* | 7/2008 | Schlack | 361/801 |
| 7,417,866 B1* | 8/2008 | Beseth et al. | 361/732 |
| 7,535,730 B2* | 5/2009 | Junkins et al. | 361/801 |
| 7,586,748 B2* | 9/2009 | Chen | 361/727 |
| 7,637,748 B2* | 12/2009 | Chung et al. | 439/59 |
| 7,684,209 B2* | 3/2010 | Roesner | 361/798 |
| 7,684,731 B2* | 3/2010 | Hirose et al. | 399/124 |
| 7,697,302 B2* | 4/2010 | Yan | 361/801 |
| 2002/0071254 A1* | 6/2002 | Tien | 361/727 |
| 2003/0035271 A1* | 2/2003 | Lelong et al. | 361/724 |
| 2004/0095718 A1* | 5/2004 | Salinas et al. | 361/685 |
| 2006/0018086 A1* | 1/2006 | Liu | 361/679 |
| 2008/0025001 A1* | 1/2008 | Igarashi et al. | 361/726 |
| 2008/0062654 A1* | 3/2008 | Mattlin et al. | 361/727 |
| 2010/0067199 A1* | 3/2010 | Chen | 361/747 |
| 2010/0134987 A1* | 6/2010 | Furholzer | 361/747 |
| 2010/0188824 A1* | 7/2010 | Benedetto et al. | 361/747 |
| 2010/0246142 A1* | 9/2010 | Phillips et al. | 361/747 |
| 2010/0265669 A1* | 10/2010 | Schnuerer et al. | 361/747 |
| 2010/0277875 A1* | 11/2010 | Moorehead et al. | 361/747 |
| 2010/0277876 A1* | 11/2010 | Yang et al. | 361/747 |

* cited by examiner

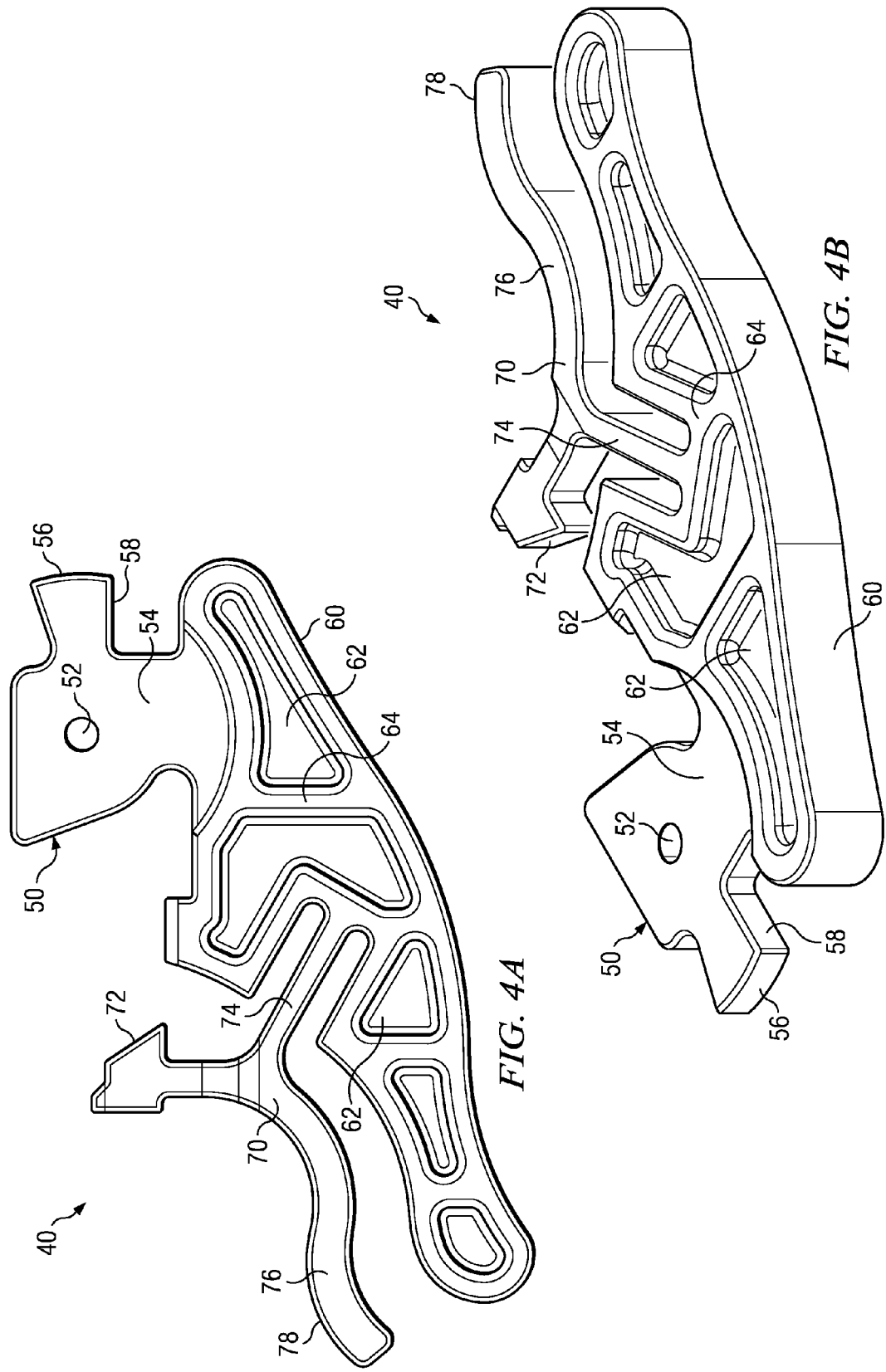

UNIBODY LATCH FOR PLUG-IN UNITS

TECHNICAL FIELD OF THE INVENTION

The present invention relates generally to modular components for a telecommunications network, and more particularly to a unibody latch for plug-in units.

BACKGROUND

Telecommunications systems, cable television systems, and data communication networks use optical networks to rapidly convey large amounts of information between remote points. In an optical network, information is conveyed in the form of optical signals through optical fibers. Optical fibers comprise thin strands of glass capable of transmitting the signals over long distances with very low loss. Optical networks provide higher capacity and reduced operating costs compared to traditional technologies. Fiber-optic networks may include a system of multiple network components, including switches, routers, converters, modulators, demodulators, etc.

A communications network may include one or more rack systems. A rack system includes two or more vertical posts providing a frame for mounting various components of the network system (e.g., a rack server). The rack system provides a plurality of mounting slots known as bays configured to hold a rack server and/or other network components. The rack system may allow multiple components to be stacked vertically, providing a relatively small footprint and simplifying cable connections between various components.

A network system component may include multiple electronic components housed in a chassis. A chassis may be a rectangular box or another housing that provides electronic and/or physical connections for the internal components disposed therein. For example, the chassis may include a motherboard, a midplane, a backplane, switches, routers, converters, modulators, demodulators, etc. In those systems, plug-in units (PIU) may be used to provide a variety of applications and functions. PIUs may be inserted into a chassis and coupled to a backplane or a midplane.

SUMMARY

In accordance with a particular embodiment of the present invention, a latch for use with a plug-in unit may comprise a head, a rigid body, a pin, and a lever. The head may be configured to retain the plug-in unit within a chassis associated with a rack system. The rigid body may extend from the head and be configured to interface with a user's fingers. The pin may extend transversely from both sides of the head into a case associated with the plug-in unit and be configured so that the head and the rigid body rotate around the pin as a single body when the rigid body is pulled by the user's fingers. The lever may extend from the rigid body and include a detent configured to engage the chassis. The detent may be configured to restrict the head and the rigid body from rotating around the pin when the detent is engaged with the chassis. The lever may be operable to release the detent from the chassis. The head, the rigid body, the lever, and the detent are manufactured as a single unitary body.

In accordance with another particular embodiment of the present invention, a case for a plug-in unit for use with a chassis mounted in a rack system may include a housing for the electronic components of the plug-in unit, a head, a rigid body, a pin, and a lever. The head may be configured to retain the plug-in unit within the chassis. The rigid body may extend from the head configured to interface with a user's fingers. The pin may extend transversely from both sides of the head into the housing and be configured so that the head and the rigid body rotate around the pin as a single body when the rigid body is pulled by the user's fingers. The lever may extend from the rigid body and include a detent configured to engage the chassis. The detent may be configured to restrict the head and the rigid body from rotating around the pin when the detent is engaged with the chassis. The lever may be operable to release the detent from the chassis. The head, the rigid body, the lever, and the detent may be manufactured as a single unitary body.

In accordance with another particular embodiment of the present invention, a rack system for use with a communications network may include two or more vertical posts, a chassis, housing for the electronic components of the plug-in unit, a head, a rigid body, a pin, and a lever. The two or more vertical posts may define bays for a plurality of chassis. The chassis may be mounted to the two or more vertical posts and provide a shelf for a plug-in unit. The head may be configured to retain the plug-in unit within the chassis. The rigid body may extend from the head configured to interface with a user's fingers. The pin may extend transversely from both sides of the head into the housing and be configured so that the head and the rigid body rotate around the pin as a single body when the rigid body is pulled by the user's fingers. The lever may extend from the rigid body and include a detent configured to engage the chassis. The detent may be configured to restrict the head and the rigid body from rotating around the pin when the detent is engaged with the chassis. The lever may be operable to release the detent from the chassis. The head, the rigid body, the lever, and the detent may be manufactured as a single unitary body.

The teachings of the present disclosure may provide a variety of benefits in comparison to known alternatives. For example, manufacturing the head, the rigid body, the lever, and the detent as a single unitary body may remove the need for spring-loaded latches, thereby reducing part count and potential failure modes. As another example, manufacturing the head, the rigid body, the lever, and the detent as a single unitary body may allow a single material to be used for manufacture (e.g., a filled plastic and/or other selected material). As another example, manufacturing the head, the rigid body, the lever, and the detent as a single unitary body may allow a single step for manufacturing (e.g., injection molding and/or stamping).

In addition, a latch with the detent and the head at separate physical locations also separates the retention load from the locking mechanism. That separation may allow a relatively high retention force provided by the head in conjunction with a relatively low removal force required to release the detent and allow the removal of the plug-in unit. It will be understood that the various embodiments of the present invention may include some, all, or none of the enumerated technical advantages. In addition, other technical advantages of the present invention may be readily apparent to one skilled in the art from the figures, description and claims included herein.

BRIEF DESCRIPTION OF THE DRAWINGS

FIGS. 4A and 4B show various views of an example latch for use with a plug-in unit, in accordance with teachings of the present disclosure.

DETAILED DESCRIPTION

Figure 1:
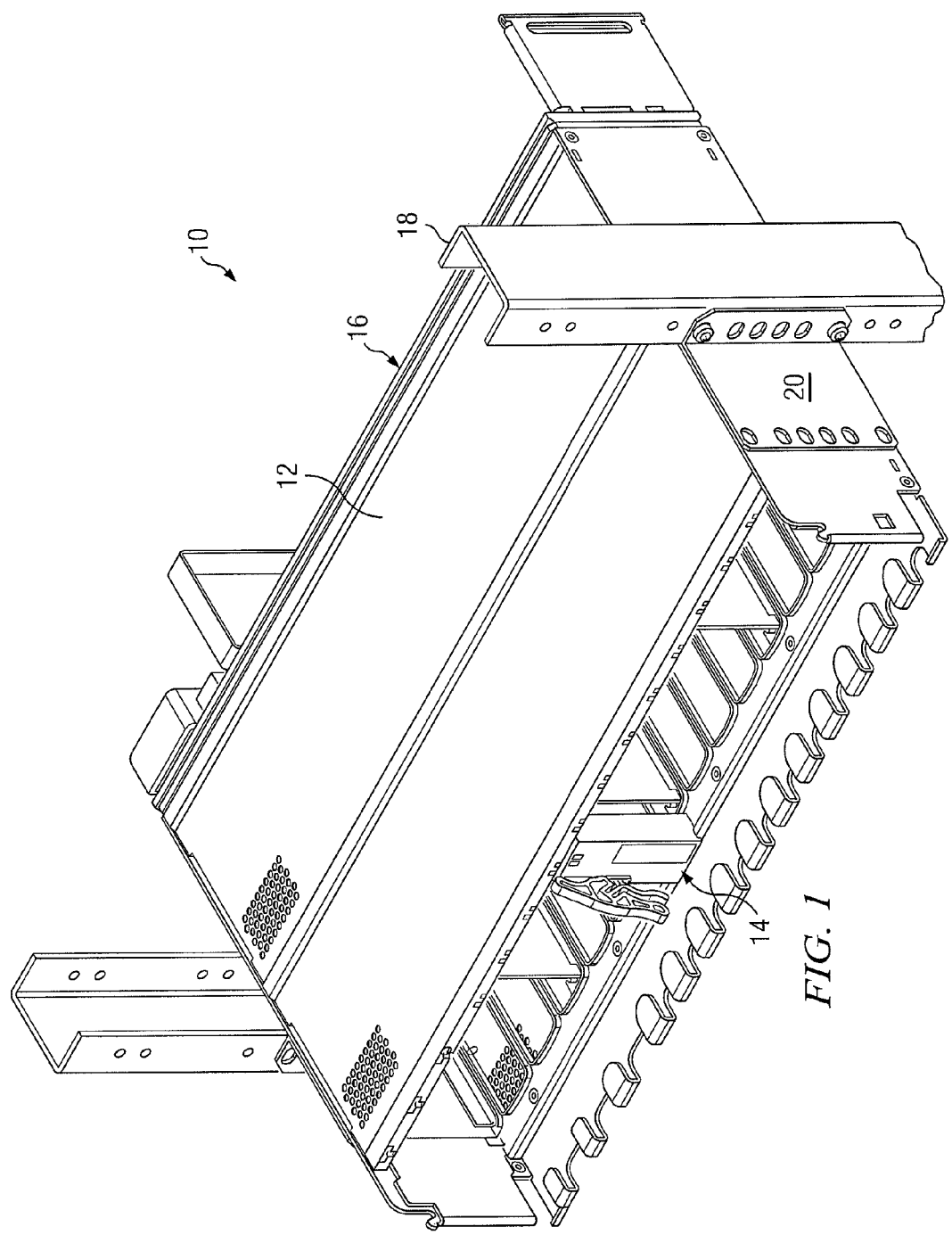
FIG. 1 illustrates example components of a communication system including a plug-in unit incorporating teachings of the present disclosure.

Preferred embodiments and their advantages are best understood by reference to FIGS. 1 through 5C, wherein like numbers are used to indicate like and corresponding parts. Modular communication systems may employ plug-in units ("PIUs") to provide a variety of functionality. PIUs may reside in a chassis coupled to a backplane and/or a midplane. FIG. 1 illustrates a rack system 10. Rack system 10 may include a chassis 12, one or more plug-in units 14, and a rack structure 18. Although not visible in FIG. 1, system 10 may include an I/O panel 16.

Rack system 10 may be used for a variety of applications. In some embodiments, rack system 10 may house various components of a communications system. Chassis 12 may provide a housing for a variety of components associated with a communications network. Chassis 12 may be connected to rack structure 18 with associated brackets 20.

Plug-in unit 14 may comprise any suitable hardware and/or software operable to provide functionality for the communications system, including any memory, processor, or other components. Plug-in unit 14 may provide networking applications, such as telecommunications or data routing. Plug-in unit 14 may comprise physical interfaces on the front side, the back side, or both to connect to other network components and send signals to and receive signals from such other network components. Other embodiments may comprise a plurality of plug-in units 14. In addition, in some systems, plug-in units 14 are allocated in pairs.

Plug-in units 14 couple to a backplane (not visible in FIG. 1) in chassis 12. The backplane may provide a variety of functions in system 10, such as providing electrical connectivity between components of system 10 and transmitting signals between these components. Plug-in units 14 may comprise any suitable connector to couple to the backplane. Rack system 10 may also house any appropriate number of plug-in units 14 or other components of rack system 10. The backplane may further comprise one or more midplane connectors (MPCs) (not visible in FIG. 1). The MPCs may receive one or more signals from one or more plug-in units 14, and may also receive one or more signals from the backplane. The MPCs may be associated with the backplane in some embodiments, or be a separate component in other embodiments. In certain embodiments, signals from one or more plug-in units 14 are coupled through the backplane to one or more MPCs. The MPCs may provide electrical connectivity to the backplane and/or to other components of the network communication system.

The communication system may further comprise one or more I/O panels 16. I/O panels 16 may provide a variety of functionality for system 10. I/O panels 16 may couple to one or more plug-in units 14 to send signals and/or receive signals from plug-in units 14. I/O panels 16 may communicate with plug-in units 14 through a backplane and/or an MPC. I/O panels 16 may also comprise a variety of connectors for transmitting one or more signals. For example, some I/O panels 16 may comprise one or more DS1 or DS3 connections. Other I/O panels 16 may comprise Ethernet connections, such as 10BASE-T, 100BASE-T, or 1000BASE-T. The type of I/O panel 16 may be selected by a user to provide the connections that the user needs for his or her applications. The user may also select an I/O panel 16 that provides a protected interface or one that provides an unprotected interface.

Figure 2:
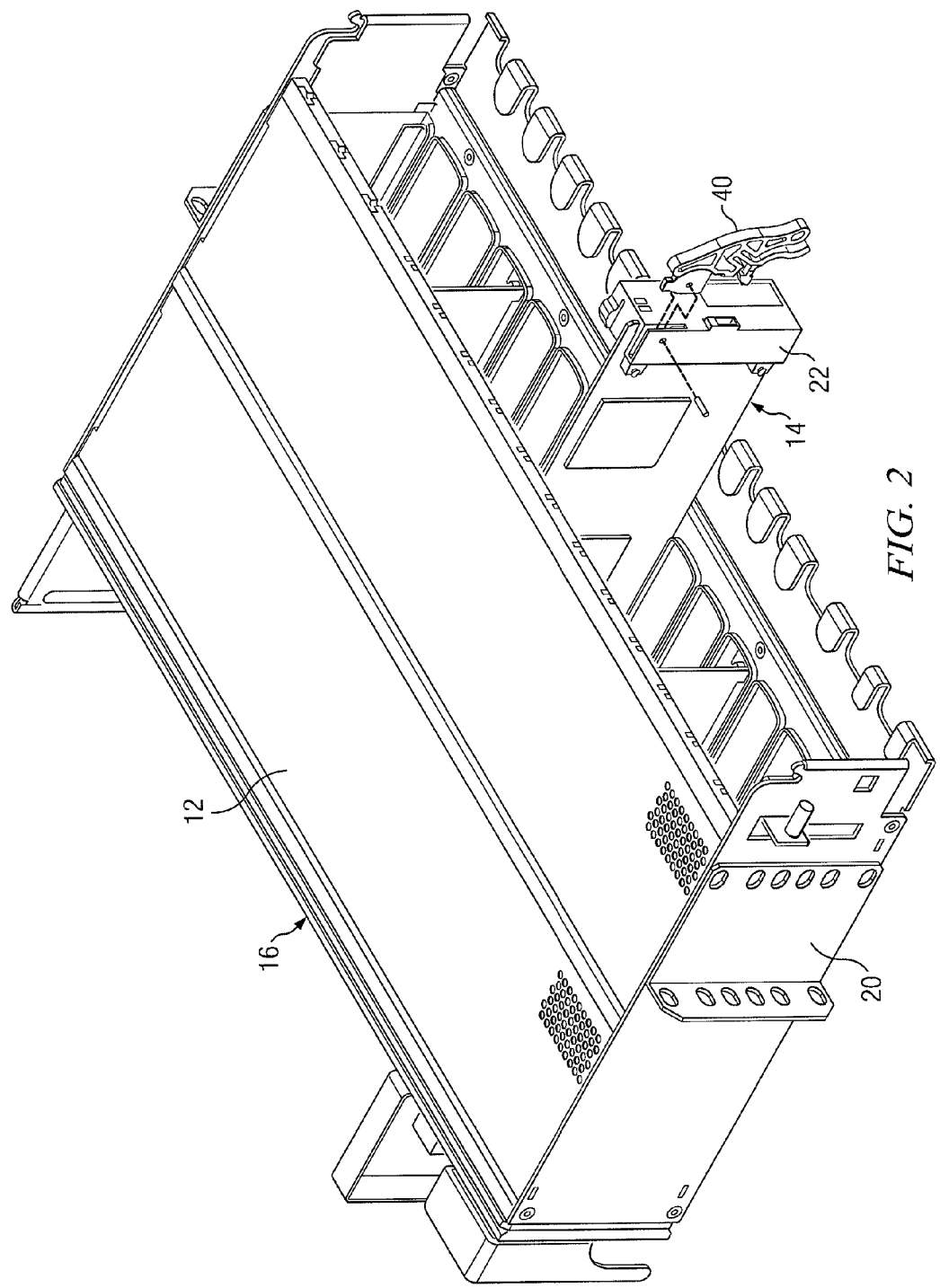
FIG. 2 illustrates an example plug-in unit partially removed from a chassis, in accordance with the teachings of the present disclosure.

FIG. 2 illustrates an example plug-in unit 14 partially removed from chassis 12, in accordance with the teachings of the present disclosure. Plug-in unit 14 may include an associated case 22 and a latch 40. Case 22 and latch 40 may operate in conjunction to attach PIU 14 to chassis 12. While various components internal to chassis 12 may provide electrical and/or physical connections for PIU 14 (e.g., a backplane), case 22 and latch 40 may provide a more robust physical retention for PIU 14. The retention provided by case 22 and latch 40 may protect the various internal connectors (e.g., a backplane and/or a midplane) from forces acting on PIU 14. Case 22 may be referred to as a "plug-in unit housing".

Figure 3:
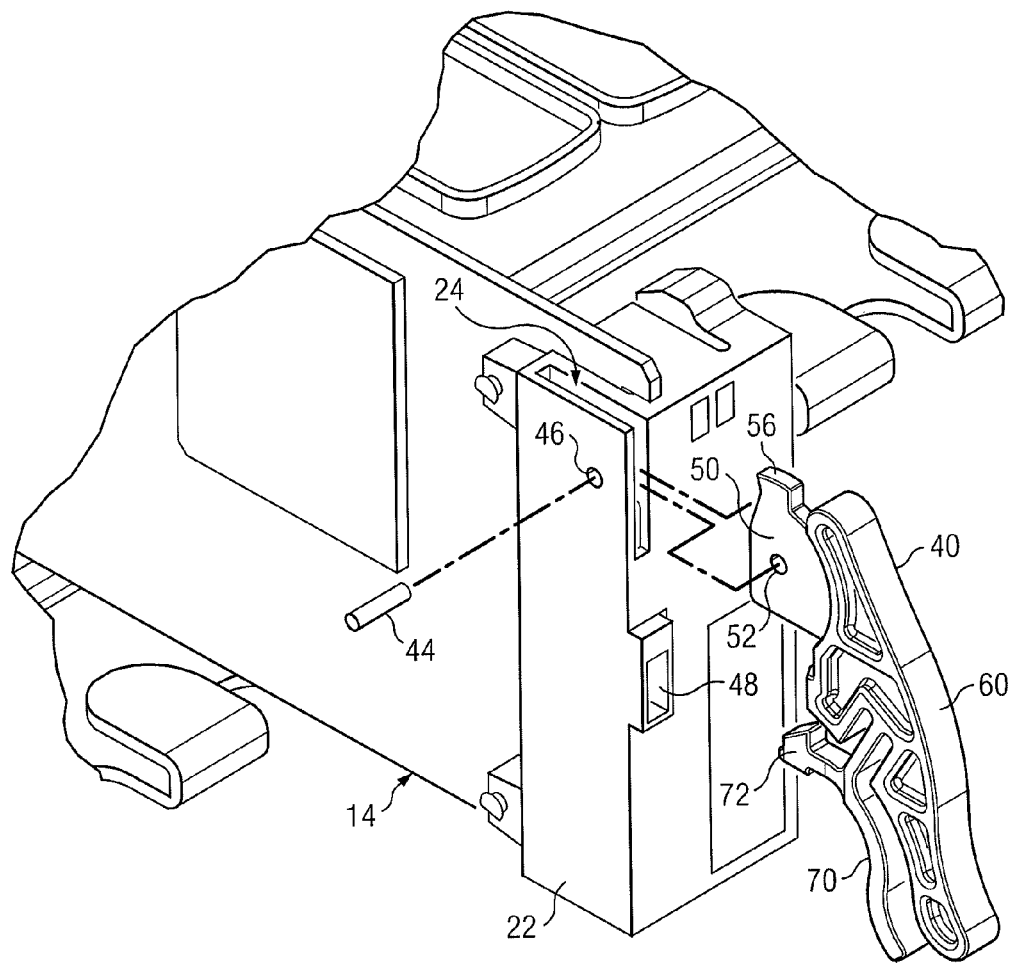
FIG. 3 illustrates a detailed view of the plug-in unit from FIG. 2.

FIG. 3 illustrates a detailed view of certain elements of PIU 14 shown in FIGS. 1 and 2, including a case 22, a latch 40, and a pin 44. PIU 14 may include any plug-in modular unit configured to interface with chassis 12 and provide additional and/or supplemental functionality to a communication network (e.g., a printed circuit board with various associated components plugging into a backplace assembly). As shown in FIGS. 1-3, PIU 14 may be configured to slide into chassis 12 so that case 22 interfaces with the front edges of chassis 12. Case 22 may be made of any appropriate material suitable for use with the communications network (e.g., plastic and/or metal).

Latch 40 may include a head 50, a rigid body 60, and a lever 70. In the embodiment shown, head 50, rigid body 60, and lever 70 may be manufactured as a unitary body. Various details regarding latch 40 are discussed below in relation to FIGS. 4A-5C.

Case 22 may also define a notch 24, a hole 46, and a slot 48 configured to interface with latch 40 and pin 44. As shown in FIG. 3, notch 24 may be configured to mount the head 50 of latch 40. Head 50 may be configured to rotate within notch 24 around pin 44. Pin 44 may be any device, component, and/or feature of case 22 configured to provide a pivot point for latch 40 and/or head 50. Pin 44 may include a head, threads, and/or any other features designed for ease of manufacturing, operation, and/or assembly. As shown in FIG. 3, pin 44 may pass through hole 46 of case 22 and hole 52 of head 50.

Head 50 of latch 40 may include a tab 56 configured to interface with one or more features, devices, and/or components associated with chassis 12 (e.g., a slot, a detent, and/or any other appropriate feature). In the embodiment shown, tab 56 may be configured to resist the removal of PIU 14 as long as tab 56, head 50, and/or latch 40 is engaged with chassis 12.

Rigid body 60 may include any portion of latch 40 configured to resist deformation. For example, rigid body 60 may include a portion of latch 40 with increased thickness compared to other portions, with ribs and/or other strengthening features, and/or other rigid characteristics. In some embodiments, rigid body 60 may provide a handle for a user to actuate latch 40.

Detent 72 of lever 70 may be configured to interface with slot 48. When detent 72 is engaged with slot 48, head 50 and tab 56 may not rotate around pin 44. As long as the rotation of head 50 and tab 56 is restricted, head 50 and tab 56 will resist the removal of PIU 14 from chassis 12. Lever 70 may include any flexible member configured to allow a user to disengage detent 72 from slot 48. As shown in FIG. 3, some embodiments may include a lever 70 extending from rigid body 60.

FIGS. 4A and 4B show various views of example latch 40 for use with PIU 14, in accordance with teachings of the present disclosure. In the embodiment shown, latch 40 includes head 50, rigid body 60, and lever 70 all manufactured as a unitary body. Different portions of the body of latch 40 may include varying thicknesses, rigidity, and/or other characteristics as described herein. Manufacturing latch 40 as a unitary body may provide several advantages. For example, latch 40 may consist of a single material throughout (e.g., metal and/or plastic), reducing assembly steps, manufacturing processes, and/or costs.

Figure 5A:
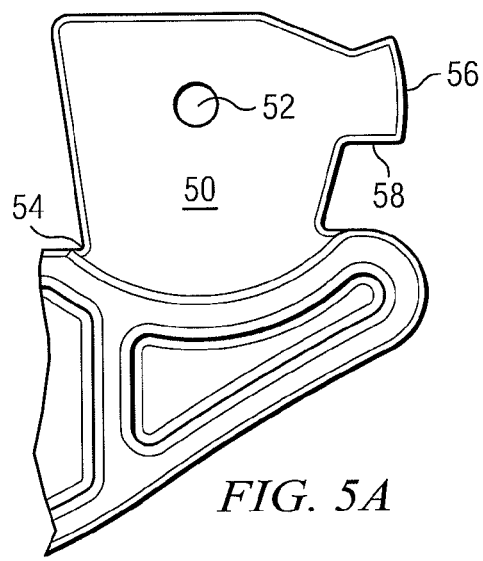
FIGS. 5A-5C show details of various example latches for use with a plug-in unit, in accordance with teachings of the present disclosure.
Figure 5B:
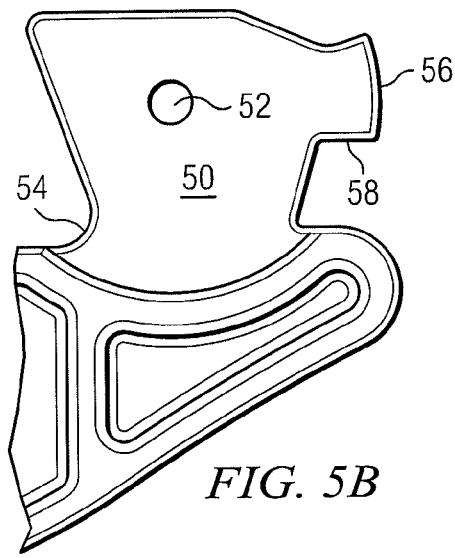
Figure 5C:
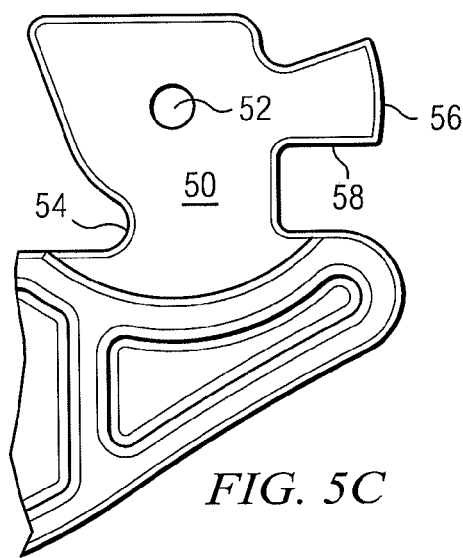

Head 50 may be configured to interact with various portions of PIU 14 and/or chassis 12. Head 50 may include a hole 52, a neck 54, and a tab 56. Hole 52 may be configured to interface with pin 44 and to provide a mount for latch 40 with case 22 of PIU 14. Hole 52 may include a simple through-hole, as shown in FIG. 4A. In other embodiments, hole 52 may include additional features (e.g., a step, a neck, etc.). Neck 54 may include any feature and/or component of head 50 configured to provide clearance, geometrical, and/or operational advantages. As described in relation to FIG. 3, tab 56 may be configured to interact with one or more features of chassis 12 (e.g., a strikeplate) to resist removal of PIU 14 from chassis 12. In the embodiment shown, tab 56 includes a face 58. Face 58 may provide a point and/or surface in contact with the one or more features of chassis 12 to transfer force from latch 40 to chassis 12. Various alternative configurations of head 50 are illustrated in FIGS. 5A-5C.

Rigid body 60 may include any portion of latch 40 configured to resist deformation. For example, rigid body 60 may be configured to provide a handle for a user to operate latch 40 as well as to transmit rotational force from the handle to head 50 without significant deformation in rigid body 60. As shown in FIGS. 4A and 4B, rigid body 60 may include a planar body 62 and ribs 64. Persons having ordinary skill in the art will be able to design and/or select a pattern of ribs 64 to optimize the balance between weight, material, and resistance to bending and/or other deformation.

Lever 70 may include any portion of latch 40 configured to flex under force applied by a user so as to move detent 72. As discussed above, detent 72 may be configured to interface with slot 48 of case 22 and to resist rotation of latch 40 around pin 44 while detent is engaged with slot 48. In the embodiment shown, lever 70 includes a y-shaped body with one leg 74 extending from rigid body 60 of latch 40. Leg 74 may be configured to provide the required flexibility by adjusting its dimensions (e.g., thickness, length, and/or width). Variation of the thickness of leg 74 may control, at least in part, the travel of detent 72 during use.

Lever 70 may include a curved handle 76 configured to match the shape of a portion of rigid body 60, as shown in FIGS. 4A and 4B. Curved handle 76 may define an interface 78 for a user's fingers when he or she actuates lever 70. If curved handle 76 matches the shape of a portion of rigid body 60, the total travel distance of curved handle 76 may be limited, which would, in turn, limit the maximum flex or rotational angle applied to leg 74 of lever 70. Limiting the maximum rotational angle traveled by leg 74 may provide additional safety against the plastic deformation of leg 74 and/or lever 70 during and/or after repeated use. Because some users may lift PIU 14 from chassis 12 using latch 40 while their fingers are engaged with handle 76, protecting leg 74 and/or lever 70 from excessive force may be important. In contrast to other latches using spring-loaded locking mechanisms, latches incorporating the teachings of the present disclosure may include fewer parts, greater reliability, and reduced cost of manufacturing.

As shown in FIGS. 4A and 4B, latch 40 incorporating the teachings of the present disclosure may provide head 50 and tab 56 physically separated from detent 72. A latch 40 with physically separated features as shown also has the insertion/removal force (e.g., head 50 and/or tab 56) applied at a location separated from the locking force (e.g., detent 72). A latch 40 with this feature may provide different required forces for insertion/removal and locking. In addition, a latch 40 with this feature may allow PIUs and chassis 12 with varying faceplate geometries. For example, latch 40 may be used with a chassis 12 in a 2U platform or a 4U platform. Latch 40 may also be scaled geometrically to provide increased force in a larger chassis 12. In one embodiment, latch 40 was tested and provided more than 80 pounds of retention force at head 50 while requiring less than 10 pounds to operate lever 70.

Another embodiment of latch 40 manufactured with Makrolon was tested to determine the travel and forces present in lever 70. In those tests, it was determined that handle 76 of lever 70 traveled 3.2 mm when 4.8 pounds of force were applied, resulting in 1.4 mm of travel for detent 72 which was sufficient to disengage with slot 48. In the same test, the maximum stress on any part of lever 70 was 63 MPa, providing a safety factor of approximately 1.5.

Another embodiment of latch 40 manufactured with Ultem was tested. In those tests, handle 76 of lever 70 traveled 3.2 mm when 6.7 pounds of force were applied. The maximum stress induced was 90 MPa, providing a safety factor of approximately 1.5.

FIGS. 5A-5C show details of various example head configurations for a latch 40 for use with plug-in unit 14, in accordance with teachings of the present disclosure. Each example head 50 includes a hole 52, a neck 54, and tab 56 as discussed with relation to FIGS. 4A and 4B. As shown in FIGS. 5A-5C, the configuration of head 50 may be adjusted to provide various advantages, including maximum retention force. Although the present invention has been described with several embodiments, various changes and modifications may be suggested to one skilled in the art. It is intended that the present invention encompass such changes and modifications as fall within the scope of the appended claims.

What is claimed is:

1. A latch for use with a plug-in unit, the latch comprising:
   a head configured to retain the plug-in unit within a chassis associated with a rack system;
   a rigid body extending from the head configured to interface with a user's fingers;
   a pin extending transversely from both sides of the head into a case associated with the plug-in unit, the pin configured so that the head and the rigid body rotate around the pin as a single body when the rigid body is pulled by the user's fingers; and
   a lever extending from the rigid body, the lever including a detent configured to engage the case;
   the detent configured to restrict the head and the rigid body from rotating around the pin when the detent is engaged with the chassis;
   the lever operable to release the detent from the chassis;
   wherein the head, the rigid body, the lever, and the detent are manufactured as a single unitary body and wherein the single unitary body includes various material thicknesses to maintain rigidity in the rigid body while allowing flexibility in the lever.

2. A latch according to claim 1, further comprising the pin manufactured as a separate body and extending through a hole disposed in the head.

3. A latch according to claim 1, wherein the head further comprises a tab configured to extend within a recess formed in the chassis and configured so that the tab is removed from the recess by the rotation of the head around the pin.

4. A latch according to claim 1, wherein the rigid body includes a generally planar member.

5. A latch according to claim 1, wherein the rigid body includes:
   a generally planar member; and
   one or more ribs extending from the planar member to increase the rigidity of the rigid body;
   wherein the rigid body is aligned so that the pin is transverse to the generally planar member.

6. A latch according to claim 1, wherein the lever includes a y-shaped extension.

7. A latch according to claim 1, further comprising:
   wherein the rigid body includes:
     a generally planar member; and
     one or more ribs extending from the planar member to increase the rigidity of the rigid body
   the lever includes a y-shaped extension having a first leg connected to the rigid body, the first leg flexible in the plane of the generally planar member.

8. A latch according to claim 1, wherein the detent and the head are physically separated along the body of the latch.

9. A case for a plug-in unit for use with a chassis mounted in a rack system, the case comprising:
   a housing for the plug-in unit;
   a head configured to retain the plug-in unit within the chassis;
   a rigid body extending from the head configured to interface with a user's fingers;
   a pin extending transversely from both sides of the head into the housing, the pin configured so that the head and the rigid body rotate around the pin as a single body when the rigid body is pulled by the user's fingers; and
   a lever extending from the rigid body, the lever including a detent configured to engage the case;
   the detent configured to restrict the head and the rigid body from rotating around the pin when the detent is engaged with the chassis;
   the lever operable to release the detent from the chassis;
   wherein the head, the rigid body, the lever, and the detent are manufactured as a single unitary body and wherein the single unitary body includes various material thicknesses to maintain rigidity in the rigid body while allowing flexibility in the lever.

10. A case according to claim 9, further comprising the pin manufactured as a separate body and extending through a hole disposed in the head.

11. A case according to claim 9, wherein the head further comprises a tab configured to extend within a recess formed in the chassis and configured so that the tab is removed from the recess by the rotation of the head around the pin.

12. A case according to claim 9, wherein the rigid body includes a generally planar member.

13. A case according to claim 9, wherein the rigid body includes:
   a generally planar member; and
   one or more ribs extending from the planar member to increase the rigidity of the rigid body;
   wherein the rigid body is aligned so that the pin is transverse to the generally planar member.

14. A case according to claim 9, wherein the lever includes a y-shaped extension.

15. A case according to claim 9, further comprising:
   wherein the rigid body includes:
     a generally planar member; and
     one or more ribs extending from the planar member to increase the rigidity of the rigid body; and
   the lever includes a y-shaped extension having a first leg connected to the rigid body, the first leg flexible in the plane of the generally planar member.

16. A rack system for use with a communications network, the rack system comprising:
   two or more vertical posts defining bays for a plurality of chassis;
   a chassis mounted to the two or more vertical posts and providing a shelf for a plug-in unit;
   a case associated with the plug-in unit;
   a head configured to retain the plug-in unit within the chassis by applying a retention force against the shelf;
   a rigid body extending from the head configured to interface with a user's fingers;
   a pin extending transversely from both sides of the head into the housing, the pin configured so that the head and the rigid body rotate around the pin as a single body when the rigid body is pulled by the user's fingers; and
   a lever extending from the rigid body, the lever including a detent configured to engage the chassis;
   the detent configured to restrict the head and the rigid body from rotating around the pin when the detent is engaged with the case;
   the lever operable to release the detent from the chassis;
   wherein the head, the rigid body, the lever, and the detent are manufactured as a single unitary body and wherein the single unitary body includes various material thicknesses to maintain rigidity in the rigid body while allowing flexibility in the lever.

17. A rack system according to claim 16, further comprising the pin manufactured as a separate body and extending through a hole disposed in the head.

18. A rack system according to claim 16, wherein the head further comprises a tab configured to extend within a recess formed in the chassis and configured so that the tab is removed from the recess by the rotation of the head around the pin.

19. A rack system according to claim 16, wherein the rigid body includes a generally planar member.

20. A rack system according to claim 16, wherein the rigid body includes:
   a generally planar member; and
   one or more ribs extending from the planar member to increase the rigidity of the rigid body;
   wherein the rigid body is aligned so that the pin is transverse to the generally planar member.

21. A rack system according to claim 16, wherein the lever includes a y-shaped extension.

22. A rack system according to claim 16, further comprising:
   wherein the rigid body includes:
     a generally planar member; and
     one or more ribs extending from the planar member to increase the rigidity of the rigid body; and
   the lever includes a y-shaped extension having a first leg connected to the rigid body, the first leg flexible in the plane of the generally planar member.

* * * * *